United States Patent
Iwamoto (10) Patent No.: US 10,096,763 B2
(45) Date of Patent: Oct. 9, 2018

(54) ELASTIC WAVE DEVICE AND METHOD FOR MANUFACTURING SAME

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1007 days.

(21) Appl. No.: 14/493,381

(22) Filed: Sep. 23, 2014

(65) Prior Publication Data

US 2015/0008789 A1 Jan. 8, 2015

Related U.S. Application Data

(63) Continuation of application No. PCT/JP2013/057489, filed on Mar. 15, 2013.

(30) Foreign Application Priority Data

Mar. 26, 2012 (JP) .................... 2012-069584

(51) Int. Cl.
*H01L 41/053* (2006.01)
*H03H 3/10* (2006.01)
(Continued)

(52) U.S. Cl.
CPC ...... *H01L 41/0533* (2013.01); *H01L 41/0805* (2013.01); *H01L 41/25* (2013.01);
(Continued)

(58) Field of Classification Search
CPC ................ H01L 41/0533; H01L 41/0805
See application file for complete search history.

(56) References Cited

U.S. PATENT DOCUMENTS

| 6,445,265 B1 | 9/2002 | Wright |
| 2001/0001293 A1 | 5/2001 | Gotoh et al. |

(Continued)

FOREIGN PATENT DOCUMENTS

| JP | 11-251866 A | 9/1999 |
| JP | 2002-534886 A | 10/2002 |

(Continued)

OTHER PUBLICATIONS

Official Communication issued in International Patent Application No. PCT/JP2013/057489, dated Jun. 18, 2013.

*Primary Examiner* — Thomas Dougherty
*Assistant Examiner* — Karen B Addison
(74) *Attorney, Agent, or Firm* — Keating & Bennett, LLP (57) ABSTRACT

An elastic wave device includes elastic wave elements, each including a piezoelectric layer directly or indirectly supported by a supporting substrate and an electrode disposed in contact with the piezoelectric layer, and a highly heat-conductive member stacked on a surface of the supporting substrate, opposite to the surface supporting the piezoelectric layer, in which the thermal conductivity of the supporting substrate is higher than the thermal conductivity of the piezoelectric layer, the coefficient of linear expansion of the supporting substrate is lower than the coefficient of linear expansion of the piezoelectric layer, the highly heat-conductive member has a larger area than the surface of the supporting substrate supporting the piezoelectric layer, and the thermal conductivity of the highly heat-conductive member is higher than that of the piezoelectric layer.

18 Claims, 10 Drawing Sheets

(51) Int. Cl.
*H03H 9/02* (2006.01)
*H03H 9/05* (2006.01)
*H03H 9/10* (2006.01)
*H03H 9/72* (2006.01)
*H01L 41/08* (2006.01)
*H01L 41/25* (2013.01)
*H03H 3/02* (2006.01)
*H03H 3/08* (2006.01)
*H03H 9/25* (2006.01)

(52) U.S. Cl.
CPC ............ *H03H 3/02* (2013.01); *H03H 3/08* (2013.01); *H03H 3/10* (2013.01); *H03H 9/02574* (2013.01); *H03H 9/02984* (2013.01); *H03H 9/059* (2013.01); *H03H 9/0523* (2013.01); *H03H 9/0576* (2013.01); *H03H 9/1071* (2013.01); *H03H 9/25* (2013.01); *H03H 9/725* (2013.01); *H01L 2224/16225* (2013.01); *Y10T 29/42* (2015.01)

(56) References Cited

U.S. PATENT DOCUMENTS

| | | |
|---|---|---|
| 2006/0022768 A1 | 2/2006 | Yokota et al. |
| 2006/0138672 A1* | 6/2006 | Sakinada ............ H03H 9/1078 257/778 |
| 2007/0182279 A1 | 8/2007 | Kawano et al. |
| 2009/0201102 A1* | 8/2009 | Oda .................... H03H 3/08 333/193 |
| 2009/0236935 A1 | 9/2009 | Kando |
| 2010/0066209 A1 | 3/2010 | Saitou et al. |
| 2010/0141086 A1 | 6/2010 | Suzuki et al. |
| 2010/0269319 A1* | 10/2010 | Omura ................ H03H 3/10 29/25.35 |
| 2011/0115334 A1 | 5/2011 | Konishi et al. |
| 2011/0278993 A1 | 11/2011 | Iwamoto |

FOREIGN PATENT DOCUMENTS

| | | | |
|---|---|---|---|
| JP | 2004-007372 A | 1/2004 | |
| JP | 2005-229566 A | 8/2005 | |
| JP | 2006-042008 A | 2/2006 | |
| JP | 2006-203149 A | 8/2006 | |
| JP | 2006203149 * | 8/2006 | ............ H03H 9/25 |
| JP | 2007-243918 A | 9/2007 | |
| JP | 2010-074418 A | 4/2010 | |
| JP | 2010-259000 A | 11/2010 | |
| JP | 201025900 * | 11/2010 | ............ H03H 9/25 |
| JP | 2011-087079 A | 4/2011 | |
| JP | 2011-109306 A | 6/2011 | |
| JP | 2012-005106 A | 1/2012 | |
| JP | 2012-054363 A | 3/2012 | |
| WO | 2008/059674 A | 5/2008 | |
| WO | 2008/078481 A1 | 7/2008 | |

* cited by examiner

ELASTIC WAVE DEVICE AND METHOD FOR MANUFACTURING SAME

BACKGROUND OF THE INVENTION

1. Field of the Invention

The present invention relates to an elastic wave device including an elastic wave element and a method for manufacturing the same, and more particularly, relates to an elastic wave device including an elastic wave element including a piezoelectric layer with a small thickness and a method for manufacturing the same.

2. Description of the Related Art

Various elastic wave devices including surface acoustic wave elements or boundary acoustic wave elements have been proposed. In an elastic wave device of this kind, in order to promote a reduction in profile, an elastic wave element is mounted on a mounting substrate by a flip chip bonding method.

In order to further promote a reduction in profile, Japanese Unexamined Patent Application Publication No. 11-251866 discloses a structure in which a surface acoustic wave element is sealed by an external resin layer. More specifically, in Japanese Unexamined Patent Application Publication No. 11-251866, the surface acoustic wave element is mounted on a mounting substrate by a flip chip bonding method. A buffer resin layer is disposed so as to cover the surface acoustic wave element, and an external resin layer is disposed on the outer side portion of the buffer resin layer. The buffer resin layer is provided in order to achieve stress relaxation and electrical insulation. The buffer resin layer is composed of a silicone resin or the like. On the other hand, the external resin is provided in order to achieve mechanical protection and enhancement in moisture resistance. The external resin layer is composed of an epoxy resin or the like.

In the elastic wave device described in Japanese Unexamined Patent Application Publication No. 11-251866, resin molding is performed using a silicone resin, an epoxy resin, or the like such that the resin is in contact with a piezoelectric substrate having poor thermal conductivity, and thus, the heat-dissipating property is unsatisfactory, which is a problem. The characteristics of the elastic wave element change with temperature. Consequently, unless the heat-dissipating property is satisfactory, stability in intended resonance characteristics and filter characteristics is impaired.

SUMMARY OF THE INVENTION

Preferred embodiments of the present invention provide an elastic wave device that achieves a reduction in profile and has an excellent heat-dissipating property, and a method for manufacturing the same.

An elastic wave device according to a preferred embodiment of the present invention includes an elastic wave element and a highly heat-conductive member. The elastic wave element includes a supporting substrate, a piezoelectric layer directly or indirectly supported by the supporting substrate, and an electrode disposed so as to be in contact with the piezoelectric layer. The supporting substrate is composed of an insulating material. The thermal conductivity of the supporting substrate preferably is set to be higher than the thermal conductivity of the piezoelectric layer, and the coefficient of linear expansion of the supporting substrate preferably is set to be lower than the coefficient of linear expansion of the piezoelectric layer.

The highly heat-conductive member is stacked on a surface of the supporting substrate, opposite to the surface supporting the piezoelectric layer, and has a larger area than the opposite surface. The thermal conductivity of the highly heat-conductive member is preferably set to be higher than that of the piezoelectric layer.

In a specific aspect of the elastic wave device according to various preferred embodiments of the present invention, the thermal conductivity of the highly heat-conductive member is preferably set to be higher than the thermal conductivity of the supporting substrate.

In another specific aspect of the elastic wave device according to various preferred embodiments of the present invention, the elastic wave device further includes a mounting substrate on which the elastic wave element is mounted, and a resin layer disposed so as to cover the elastic wave element mounted on the mounting substrate. The thermal conductivity of the highly heat-conductive member preferably is set to be higher than the thermal conductivity of the resin layer. Consequently, the heat generated in the elastic wave element is dissipated more rapidly.

In another specific aspect of the elastic wave device according to various preferred embodiments of the present invention, a plurality of elastic wave elements are provided as the elastic wave element. In this case, it is possible to provide an elastic wave device which uses a plurality of frequency bands or an elastic wave filter device which includes a plurality of elastic wave elements.

In another specific aspect of the elastic wave device according to various preferred embodiments of the present invention, in the plurality of elastic wave elements, the resonant frequency or center frequency of at least one elastic wave element is different from the resonant frequency or center frequency of the other elastic wave element(s). In this case, it is possible to provide an elastic wave device which is capable of being used in a plurality of frequency bands.

In another specific aspect of various preferred embodiments of the present invention, the highly heat-conductive member extends over the plurality of elastic wave elements so as to be commonly used by the plurality of elastic wave elements. In this case, the number of components is reduced and the manufacturing process is simplified. In addition, since the highly heat-conductive member extends over spaces between the elastic wave elements, the heat-dissipating property is further enhanced.

In another specific aspect of the elastic wave device according to various preferred embodiments of the present invention, the supporting substrate is composed of at least one material selected from the group consisting of aluminum oxide, aluminum nitride, boron nitride, silicon carbide, silicon, and magnesium oxide. In this case, the heat-dissipating property is more effectively enhanced.

In another specific aspect of the elastic wave device according to various preferred embodiments of the present invention, the highly heat-conductive member is composed of a material that contains, as a main component, at least one selected from the group consisting of aluminum oxide, aluminum nitride, boron nitride, silicon carbide, magnesium oxide, and silicon. In this case, the heat-dissipating property is further enhanced.

In another specific aspect of the elastic wave device according to various preferred embodiments of the present invention, the elastic wave device further includes an inorganic filler-containing resin layer which is disposed so as to be in contact with the highly heat-conductive member and which is composed of an inorganic filler-containing resin material. In this case, the heat dissipated rapidly from the highly heat-conductive member is more effectively dissipated to the environment by the inorganic filler-containing resin layer.

In another specific aspect of the elastic wave device according to various preferred embodiments of the present invention, the highly heat-conductive member is composed of a metal.

In another specific aspect of the elastic wave device according to various preferred embodiments of the present invention, the inorganic filler-containing resin layer is a resin layer that covers the elastic wave element.

In another specific aspect of the elastic wave device according to various preferred embodiments of the present invention, the highly heat-conductive member is composed of an inorganic filler-containing resin material in which an inorganic filler is dispersed in a resin. In this case, the heat-dissipating property is further enhanced.

In another specific aspect of the elastic wave device according to various preferred embodiments of the present invention, the inorganic filler-containing resin material is an inorganic filler-containing resin material in which at least one filler selected from the group consisting of aluminum oxide, aluminum nitride, boron nitride, silicon carbide, magnesium oxide, silicon, silicon oxide, carbon, and cerium oxide is dispersed in a resin. In this case, since the inorganic filler-containing resin material is a resin composite material, the formation and processing of the highly heat-conductive member are facilitated.

In another specific aspect of the elastic wave device according to various preferred embodiments of the present invention, the electrode includes an Al electrode layer containing aluminum as a main component and formed of an epitaxially grown, oriented film. In this case, since the stress-induced migration resistance of the electrode increases, electric power handling capability is effectively increased.

A method for manufacturing an elastic wave device according to another preferred embodiment of the present invention is a method for manufacturing the elastic wave device according to other preferred embodiments of the present invention. The manufacturing method includes the steps of performing ion implantation from a surface of a piezoelectric substrate having a larger thickness than the piezoelectric layer; stacking a temporary supporting member on the surface of the piezoelectric substrate on which the ion implantation has been performed; while heating the piezoelectric substrate, separating a piezoelectric layer, at a high concentration ion-implanted region of the piezoelectric substrate in which the implanted ion concentration is highest, from a remaining portion of the piezoelectric substrate such that the piezoelectric layer remains on the temporary supporting member; directly or indirectly stacking a supporting substrate on a surface of the piezoelectric layer, opposite to the surface on which the temporary supporting member is disposed; separating the temporary supporting member from the piezoelectric layer directly or indirectly stacked on the supporting substrate; forming an electrode on the piezoelectric layer to constitute an elastic wave element including the supporting substrate, the piezoelectric layer, and the electrode; and providing a highly heat-conductive member on a surface of the supporting substrate of the elastic wave element, opposite to the surface on which the piezoelectric layer is directly or indirectly stacked, the highly heat-conductive member having a larger area than the opposite surface and being composed of a highly heat-conductive material having a higher thermal conductivity than the piezoelectric layer.

In a specific aspect of the method for manufacturing an elastic wave device according to various preferred embodiments of the present invention, in the step of stacking the supporting substrate on the piezoelectric layer, a dielectric layer having a higher thermal conductivity than the piezoelectric layer is formed on the piezoelectric layer, and the supporting substrate is stacked on the dielectric layer. In this case, the heat-dissipating property is further enhanced.

In another specific aspect of the method for manufacturing an elastic wave device according to various preferred embodiments of the present invention, the method further includes a step of forming a plurality of elastic wave elements, each being the elastic wave element described above, and mounting the plurality of elastic wave elements on a mounting substrate such that the electrodes thereof face the mounting substrate, and a step of stacking the highly heat-conductive member on surfaces of the supporting substrates of the mounted elastic wave elements, opposite to the surfaces on which the piezoelectric layers are disposed. In this case, since a plurality of elastic wave elements are mounted on the mounting substrate by a flip chip bonding method, the reduction in profile of the elastic wave device is achieved.

In another specific aspect of the method for manufacturing an elastic wave device according to various preferred embodiments of the present invention, the highly heat-conductive member is formed so as to extend over the plurality of elastic wave elements. In this case, the manufacturing process of the elastic wave device is simplified. Furthermore, the heat-dissipating property is further enhanced.

In another specific aspect of the method for manufacturing an elastic wave device according to various preferred embodiments of the present invention, the method further includes a step of forming an inorganic filler-containing resin layer in contact with the highly heat-conductive member. In this case, the heat-dissipating property is further enhanced.

In the elastic wave device according to various preferred embodiments of the present invention, the thermal conductivity of the supporting substrate preferably is set to be higher than the thermal conductivity of the piezoelectric layer, and the highly heat-conductive member is stacked on a surface of the supporting substrate, opposite to the surface which supports the piezoelectric layer. Therefore, the heat generated in the elastic wave element is rapidly dissipated through the supporting substrate and the highly heat-conductive member. Consequently, the heat-dissipating property of the elastic wave device is effectively enhanced. Accordingly, it is possible to provide an elastic wave device having stable frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

Figure 10:
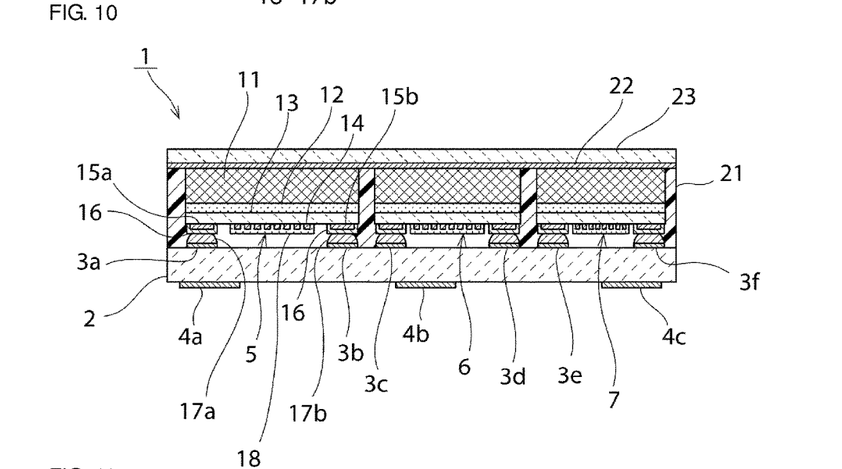
FIG. 10 is an elevational cross-sectional view of an elastic wave device according to the first preferred embodiment of the present invention.

FIG. 10 is an elevational cross-sectional view of an elastic wave device according to a first preferred embodiment of the present invention.

An elastic wave device 1 includes a mounting substrate 2. The mounting substrate 2 is composed of an appropriate insulating material, such as an insulating ceramic, e.g., alumina, or a synthetic resin. Electrode lands 3a to 3f are disposed on the upper surface of the mounting substrate 2. Furthermore, outer electrodes 4a to 4c are disposed on the lower surface of the mounting substrate 2. The outer electrodes 4a to 4c are appropriately connected to the electrode lands 3a to 3f by via-hole electrodes or the like (not shown).

The electrode lands 3a to 3f and the outer electrodes 4a to 4c are composed of an appropriate conductive material, such as a metal.

In the elastic wave device 1, elastic wave elements 5 to 7 are mounted on the mounting substrate 2 by a flip chip bonding method. The elastic wave element 5 includes a supporting substrate 11. The supporting substrate 11 is composed of an insulator. The thermal conductivity of the supporting substrate 11 is preferably set to be higher than the thermal conductivity of a piezoelectric layer which will be described later, and the coefficient of linear expansion of the supporting substrate 11 is preferably set to be lower than the coefficient of linear expansion of the piezoelectric layer. As the material constituting such a supporting substrate, an appropriate insulating material can be used. Preferably, the supporting substrate is composed of at least one material selected from the group consisting of aluminum oxide, aluminum nitride, boron nitride, silicon carbide, silicon, and magnesium oxide. In this case, the heat-dissipating property is effectively enhanced. More preferably, aluminum nitride is used. Aluminum nitride has a high thermal conductivity and a high insulating property. Furthermore, an aluminum nitride film has high strength and excellent workability even at a small thickness, and is inexpensive. In the case of silicon among the materials described above, silicon is limited to high-purity silicon with a low impurity concentration, produced by an FZ method, and with a high resistivity of higher than 1 kΩ·cm.

A dielectric layer 12 is disposed on the lower surface of the supporting substrate 11. The use of the dielectric layer 12 is not essential in the present invention. However, by appropriately selecting the material for the dielectric layer 12, for example, by forming the dielectric layer 12 so as to have a layered structure including a layer having a relatively high acoustic velocity and a layer having a relatively low acoustic velocity, characteristics of the elastic wave element 5 are improved. An appropriate dielectric material may be selected depending on the purpose of improvement of characteristics. Examples of such a dielectric material include silicon oxide, silicon nitride, silicon oxynitride, a metal oxide, a metal nitride, and diamond-like carbon.

Preferably, the dielectric layer 12 is composed of a material having excellent thermal conductivity. That is, preferably, the dielectric layer 12 has a higher thermal conductivity than a piezoelectric layer 13, which will be described below. Thus, heat generated in the piezoelectric layer 13, i.e., the functional portion of the elastic wave element, is efficiently dissipated toward the supporting substrate 11. Consequently, the dielectric layer 12 is preferably composed of a dielectric material having high thermal conductivity, such as aluminum nitride.

The dielectric layer 12 may be composed of the same material as that of the supporting substrate 11, for example.

The piezoelectric layer 13 is stacked on the lower surface of the dielectric layer 12. The piezoelectric layer 13 is composed of a piezoelectric single crystal, such as $LiTaO_3$ or $LiNbO_3$. The thickness of the piezoelectric layer 13 is relatively small at about 0.2 μm to about 1.2 μm, for example. Such a thin piezoelectric layer 13 can be formed by an ion-implantation separation method, which will be described later. In the present invention, the thickness of the piezoelectric layer 13 is not limited in the range described above, and a piezoelectric layer 13 defined by a piezoelectric body having a larger thickness may be provided. Furthermore, the piezoelectric layer 13 may be composed of a piezoelectric ceramic, such as a PZT ceramic.

An IDT electrode 14 and electrode lands 15a and 15b are disposed on the lower surface of the piezoelectric layer 13. Wiring electrodes 16 are disposed so as to cover the electrode lands 15a and 15b. The wiring electrodes 16 electrically connect the IDT electrode 14 to the electrode lands 15a and 15b. Bumps 17a and 17b are joined to the electrode lands 15a and 15b via the wiring electrodes 16. The bumps 17a and 17b are composed of a metal, such as Au or a solder. The bumps 17a and 17b are joined to the electrode lands 3a and 3b.

The IDT electrode 14, the electrode lands 15a and 15b, and the wiring electrodes 16 can be formed of an appropriate metal. Preferably, the IDT electrode 14 includes, as a main electrode layer, an electrode layer containing aluminum as a main component and formed of an epitaxially grown, oriented film. In this case, the structure of the main electrode layer includes a structure in which the entire IDT electrode 14 is an aluminum electrode composed of the epitaxially grown, oriented film. Furthermore, the IDT electrode 14 may include a multilayer metal film in which a plurality of metal films are stacked. In such a case, a main metal film portion of the multilayer metal film is required to be formed of an aluminum electrode composed of the epitaxially grown, oriented film.

The aluminum electrode layer composed of an epitaxially grown, oriented film has high stress-induced migration resistance. Therefore, in the elastic wave device 1 having an excellent heat dissipation effect according to this preferred embodiment, as long as a rise in temperature is suppressed, the IDT electrode 14 is unlikely to break even if a considerably large amount of electrical power is applied. Consequently, electric power handling capability is effectively increased.

Furthermore, an epitaxially grown, oriented film containing aluminum as a main component can be formed, for example, in the following manner. A piezoelectric layer 13 is formed of a piezoelectric single crystal, such as $LiTaO_3$. A Ti film is formed with a thickness of about 10 nm on the piezoelectric layer 13 composed of the piezoelectric single crystal while heating to a temperature of about 100° C. to about 200° C., for example. Then, in the same heating temperature range, a material containing aluminum as a main component is formed by a thin-film deposition process.

A protective layer 18 is disposed so as to cover the IDT electrode 14. Although the use of the protective layer 18 is not essential in the present invention, formation of the protective layer 18 can protect the IDT electrode 14 and enhance moisture resistance. As the material constituting the protective layer 18, for example, an appropriate insulating material, such as silicon oxide, can be used. Furthermore, in the case where silicon oxide is used as the protective layer 18, the frequency-temperature characteristics of the elastic wave element is improved.

In the elastic wave device 1, the elastic wave element 5 having the structure described above is mounted on the mounting substrate 2 by a flip chip bonding method. That is, the elastic wave element 5 is mounted on the mounting substrate 2 such that the IDT electrode 14 faces the mounting substrate 2. Elastic wave elements 6 and 7 each have the same structure as that of the elastic wave element 5, and are mounted on the mounting substrate 2 by the flip chip bonding method in the same manner. Note that the elastic wave elements 5, 6, and 7 are configured to have different resonant frequencies. Accordingly, as shown in FIG. 10, the elastic wave elements 5, 6, and 7 are different in size.

A sealing resin layer 21 is disposed so as to surround the elastic wave elements 5 to 7. In this preferred embodiment, the sealing resin layer 21 is composed of an inorganic filler-containing resin material.

Furthermore, the sealing resin layer 21 is arranged so as to cover the peripheral side surfaces of the elastic wave elements 5 to 7. For example, in the elastic wave element 5, the sealing resin layer 21 is disposed so as not to extend to the space between the IDT electrode 14 and the mounting substrate 2.

The upper surface of the sealing resin layer 21 is flush with the upper surface of the supporting substrate 11, i.e., the upper surface of the elastic wave element 5. In this preferred embodiment, the upper surface of each of the elastic wave elements 6 and 7 is also flush with the upper surface of the elastic wave element 5. A highly heat-conductive member 23 is disposed so as to cover the upper surfaces of the sealing resin layer 21 and the elastic wave elements 5 to 7 with an inorganic filler-containing resin layer 22 therebetween. The inorganic filler-containing resin layer 22 is composed of an inorganic filler-containing resin material.

As the inorganic filler, appropriate inorganic particles having a higher thermal conductivity than the piezoelectric layer 13 can be used. As the inorganic material constituting such inorganic particles, appropriate particles containing, as a main component, aluminum oxide, aluminum nitride, boron nitride, silicon carbide, magnesium oxide, silicon, silicon oxide, carbon, cerium oxide, or the like are preferably used. Thus, the heat-dissipating property is further enhanced. Furthermore, the resin in which the inorganic filler is dispersed is not particularly limited, and an epoxy resin, a silicone resin, or the like may be used.

The thickness of the inorganic filler-containing resin layer 22 is preferably set to about 1 µm to about 15 µm, for example. When the thickness is more than about 15 µm, the effect of improving the heat-dissipating property by the highly heat-conductive member 23 may be reduced. On the other hand, when the thickness is less than about 1 µm, there is a concern that adhesion failure of the highly heat-conductive layer may occur.

One of the unique features of the present preferred embodiment is that the highly heat-conductive member 23 is stacked on a surface of the supporting substrate 11, opposite to the surface on which the piezoelectric layer 13 is disposed, with the inorganic filler-containing resin layer 22 therebetween. That is, the highly heat-conductive member 23 is indirectly stacked on the supporting substrate 11.

The highly heat-conductive member 23 is composed of a material having a higher thermal conductivity than the piezoelectric layer 13. Preferably, the thermal conductivity of the highly heat-conductive member 23 is higher than the thermal conductivity of a member surrounding the highly heat-conductive member 23, i.e., a member in contact with the highly heat-conductive member 23. Examples of such a surrounding member include the sealing resin layer 21 and the inorganic filler-containing resin layer 22 in contact with the highly heat-conductive member 23.

The material constituting the highly heat-conductive member 23 is not particularly limited as long as it has a higher thermal conductivity than the piezoelectric layer 13. As such a material, a material that contains, as a main component, at least one material selected from the group consisting of aluminum oxide, aluminum nitride, boron nitride, silicon carbide, magnesium oxide, and silicon may be preferably used. Furthermore, the highly heat-conductive member 23 may be composed of the inorganic filler-containing resin material used to form the sealing resin layer. Furthermore, from the viewpoint of characteristics of the elastic wave device, the highly heat-conductive member is preferably an insulator. Moreover, there may be a case where use of a metal as the highly heat-conductive member is unsuitable from the standpoint of degradation of the insulating property of the supporting substrate due to diffusion into the supporting substrate or the like. However, in the case where the supporting substrate is composed of any one of aluminum oxide, aluminum nitride, boron nitride, silicon carbide, silicon, and magnesium oxide, even when a metal mainly composed of Cu or Ni is used as the material for the highly heat-conductive member, in view of the dielectric constant of the supporting substrate, the effect on characteristics of the elastic wave device is insignificant, and diffusion into the supporting substrate causes no problems. Therefore, the structure in which a metal material is directly deposited by vapor deposition, sputter deposition, or plating film deposition on the back of the supporting substrate can be used. In this case, a large heat dissipation effect can be obtained, which is preferable.

The highly heat-conductive member 23 is indirectly stacked on the upper surface of the supporting substrate 11, and has a larger area than the upper surface of the supporting substrate 11.

During the operation of the elastic wave device 1, heat is generated in a portion in which the piezoelectric layer 13 and the IDT electrode 14 are in contact with each other. The heat is dissipated rapidly through the supporting substrate 11 having excellent thermal conductivity from the inorganic filler-containing resin layer 22 to the highly heat-conductive member 23. On the other hand, the highly heat-conductive member 23 has a larger area than the surface of the supporting substrate 11 on which the highly heat-conductive member 23 is stacked, and has a higher thermal conductivity than the piezoelectric layer 13. Therefore, the transmitted heat is rapidly dissipated to the outside. Accordingly, in the elastic wave device 1 according to this preferred embodiment, the heat-dissipating property is effectively enhanced, and an elastic wave device 1 having stable characteristics is provided.

Furthermore, in the case where the thermal conductivity of the supporting substrate 11 is set to be higher than the thermal conductivity of the surrounding member, the transmitted heat is more rapidly dissipated to the outside.

Figure 3:
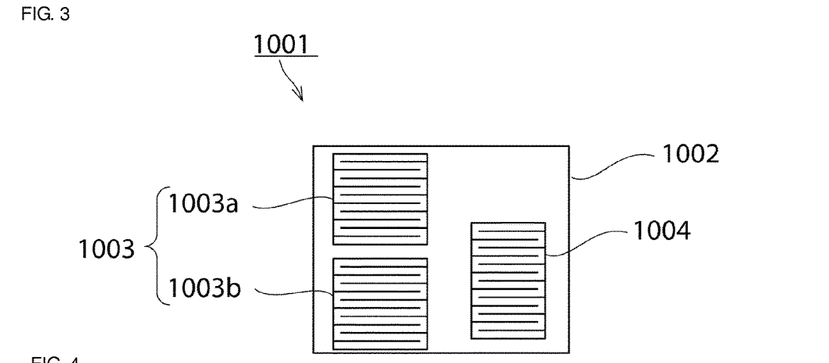
FIG. 3 is a schematic plan view of a known elastic wave device.

Furthermore, in this preferred embodiment, since the heat-dissipating property is enhanced, the size of the elastic wave device is significantly reduced. This will be described with reference to FIGS. 3 and 4. FIG. 3 is a schematic plan view of a known elastic wave device serving as a duplexer for a cellular phone. In an elastic wave device 1001, a transmitter filter 1003 and a receiver filter 1004 are configured on a mounting substrate 1002. In the transmitter filter 1003, since a large amount of electrical power is applied, a division into two portions, a first transmitter filter portion 1003a and a second transmitter filter portion 1003b, is necessary as shown in FIG. 3.

Figure 4:
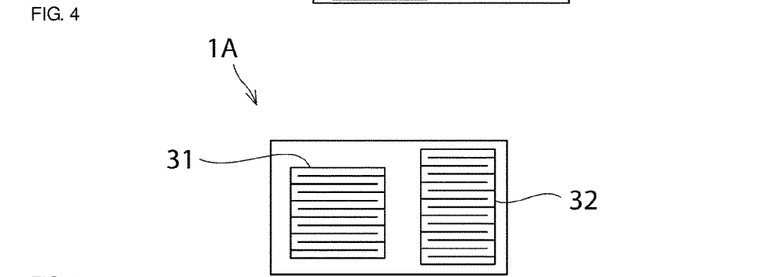
FIG. 4 is a schematic plan view illustrating the advantage of the elastic wave device according to the first preferred embodiment of the present invention.

In contrast, as shown in a schematic plan view of FIG. 4, in an elastic wave device 1A in which the elastic wave device 1 according to this preferred embodiment is applied, since the heat-dissipating property is enhanced, it is not necessary to divide a transmitter filter 31 into two portions. A receiver filter 32 is disposed on the side of the transmitter filter 31 as in the known example. Since a division is not necessary in the transmitter filter 31 because of the enhanced heat-dissipating property, a significant reduction in size is achieved in the elastic wave device 1A used as a duplexer.

Electric power was inputted into each of the elastic wave device 1 according to the present preferred embodiment and the known elastic wave device 1001, and the degree of increase in temperature was measured. As a result, in the known elastic wave device, the temperature of the device increased to 203° C. when electric power was inputted, whereas in the elastic wave device according to the present preferred embodiment, the temperature of the device increased only to 76° C. As is evident from this result, the heat-dissipating property is markedly improved.

As described above, according to a preferred embodiment of the present invention, since the heat-dissipating property of the elastic wave device is enhanced, electric power handling capability is enhanced, and the change in characteristics with temperature is prevented. Consequently, in the case where the elastic wave devices of various preferred embodiments of the present invention is used for a filter, a duplexer, or the like, as described above, it is possible to reduce the need for dividing a resonator. Accordingly, the insertion loss in the duplexer characteristics is reduced.

Figure 11:
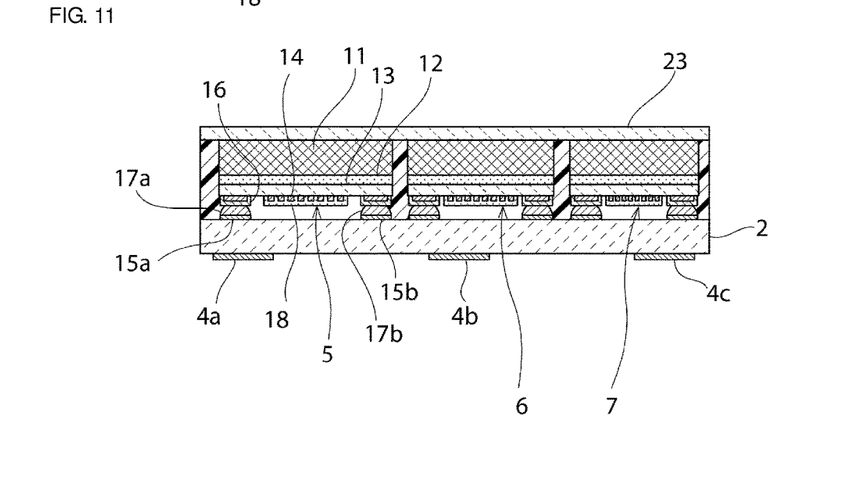
FIG. 11 is an elevational cross-sectional view of an elastic wave device according to a modification example of the first preferred embodiment of the present invention.

FIG. 11 is an elevational cross-sectional view of a modification example of the elastic wave device 1 according to the first preferred embodiment. The elastic wave device according to this modification example is the same as the first preferred embodiment except that the inorganic filler-containing resin layer 22 is not provided. That is, as shown in FIG. 11, the highly heat-conductive member 23 may be directly stacked on the upper surface of the supporting substrate 11. In this case, the supporting substrate 11 has a high thermal conductivity, and the heat transmitted to the supporting substrate 11 is rapidly dissipated from the highly heat-conductive member 23 to the outside.

A non-limiting example of a method for manufacturing the elastic wave device 1 according to the preferred embodiment described above will be described below with reference to FIGS. 1a-1E and 2A-2C and FIGS. 5 to 9.

Figure 1A:
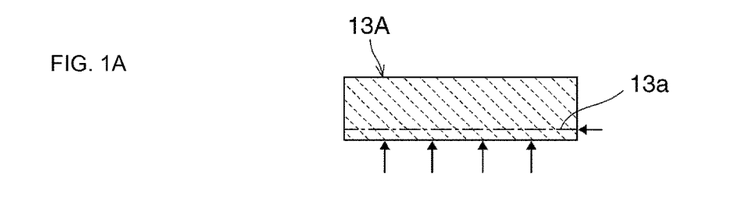
FIGS. 1A to 1E are elevational cross-sectional views illustrating manufacturing steps of an elastic wave device according to a first preferred embodiment of the present invention.

First, a piezoelectric substrate 13A shown in FIG. 1A is prepared. In this preferred embodiment, a LiTaO$_3$ single crystal substrate is used. Hydrogen ions are implanted from the lower surface of the piezoelectric substrate 13A as indicated by the arrows shown in FIG. 1A. The ions to be implanted are not limited to hydrogen, and helium or the like may be used.

The energy for ion implantation is not particularly limited. In this preferred embodiment, the amount of energy is 80 Kev with a dose of $1.0 \times 10^{17}$ atoms/cm$^2$. The amount of energy during ion implantation may be adjusted depending on the thickness of the finally obtained piezoelectric layer 13.

When ion implantation is performed, the ion concentration is distributed in the thickness direction in the piezoelectric substrate 13A. In FIG. 1A, the dashed line represents a region in which the ion concentration is highest. In a high concentration ion-implanted region 13a in which the ion concentration is highest represented by the dashed line, when heating is performed, separation easily occurs due to stress. Such a method in which separation is performed using the high concentration ion-implanted region is disclosed in Japanese Unexamined Patent Application Publication No. 2002-534886.

Figure 1B:
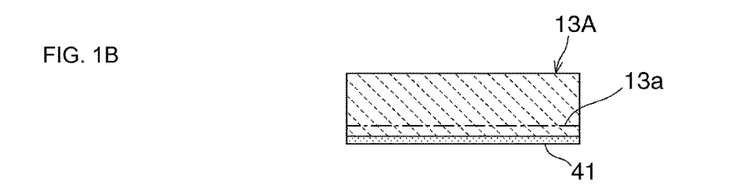

Next, as shown in FIG. 1B, an etching layer 41 is formed on the ion-implanted surface of the piezoelectric substrate 13A. The etching layer 41 is a layer that is removed by etching in a subsequent step. In this preferred embodiment, a Cu film is formed by sputtering as the etching layer 41.

Figure 1C:
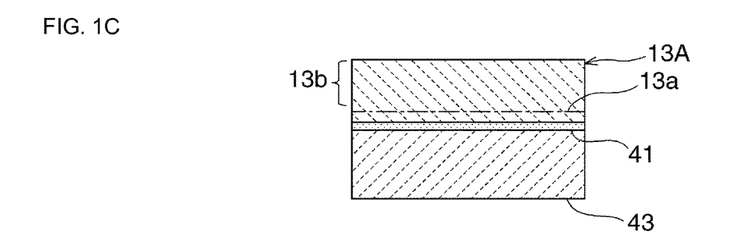

Next, as shown in FIG. 1C, a temporary supporting member 43 is bonded to the lower surface of the etching layer 41. Since the temporary supporting member 43 is removed in the subsequent step, the material therefor is not particularly limited. In this preferred embodiment, a LiTaO$_3$ single crystal substrate is used as the temporary supporting member 43. An insulating ceramic, such as alumina, may also be used.

Next, under heating, a piezoelectric substrate portion 13b located on the upper side of the high concentration ion-implanted region 13a in the piezoelectric substrate 13A is separated. The heating temperature may be set at about 250° C. to about 400° C. When stress is applied by heating such that the two sides move away from each other with the high concentration ion-implanted region 13a therebetween, the piezoelectric substrate portion 13b becomes easily separated.

Figure 1D:
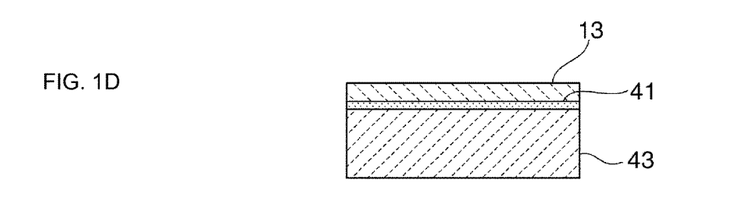

By the separation under heating, as shown in FIG. 1D, the piezoelectric layer 13 with a thickness of about 0.5 μm is allowed to remain on the etching layer 41.

The thermal conductivity of the piezoelectric layer 13 is lower than that of the supporting substrate 11. Consequently, in view of the heat-dissipating property, the thickness of the piezoelectric layer 13 is desirably small. In this preferred embodiment, by using the ion-implantation separation method described above, it is possible to form a piezoelectric layer 13 with a small and uniform thickness that cannot be obtained by mechanical processing. Therefore, in the manufacturing method according to the present preferred embodiment, it is possible to provide an elastic wave device which has an excellent heat-dissipating property, and thus in which electric power handling capability is effectively enhanced.

In the present invention, the method of forming the piezoelectric layer is not limited to the ion-implantation separation method. However, by using the manufacturing method using the ion-implantation method, an elastic wave device having a piezoelectric layer is easily obtained.

Next, the surface exposed by the separation is planarized by grinding or the like.

Figure 1E:
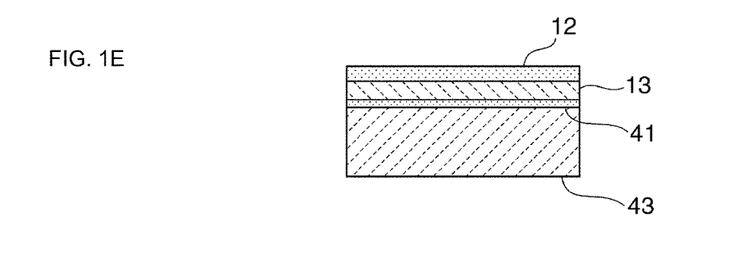

Then, as shown in FIG. 1E, a dielectric layer 12 is formed on the piezoelectric layer 13. The dielectric layer 12 is preferably composed of silicon oxide in this preferred embodiment. However, the dielectric layer 12 can be formed using any of the various dielectric materials described above.

The dielectric layer 12 can be formed using an appropriate thin-film deposition process, such as sputtering.

Figure 2A:
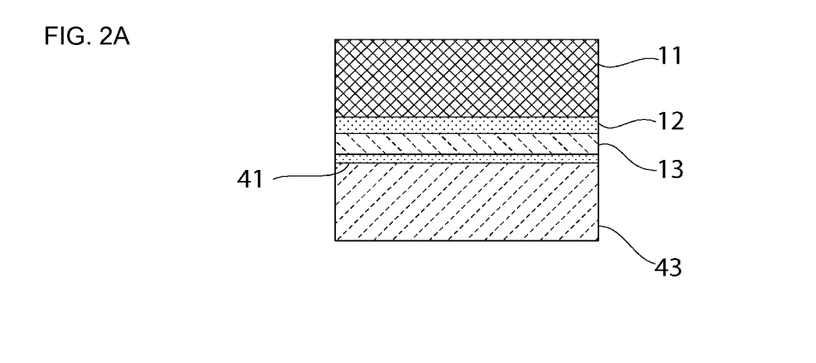
FIGS. 2A to 2C are elevational cross-sectional views illustrating manufacturing steps of the elastic wave device according to the first preferred embodiment of the present invention.

Next, as shown in FIG. 2A, a supporting substrate 11 is bonded to the dielectric layer 12. The bonding can be performed by activation bonding, bonding through a resin layer or SOG material layer, or the like.

Figure 2B:
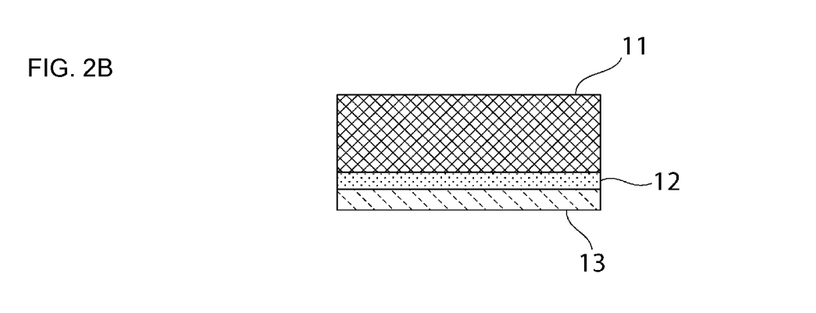

Next, using an etchant that dissolves the etching layer 41, the etching layer 41 is removed. In this preferred embodiment, since the etching layer 41 is composed of Cu, the etching layer 41 is removed using nitric acid. In such a manner, as shown in FIG. 2B, a structure in which the supporting substrate 11, the dielectric layer 12, and the piezoelectric layer 13 are stacked is obtained.

Figure 2C:
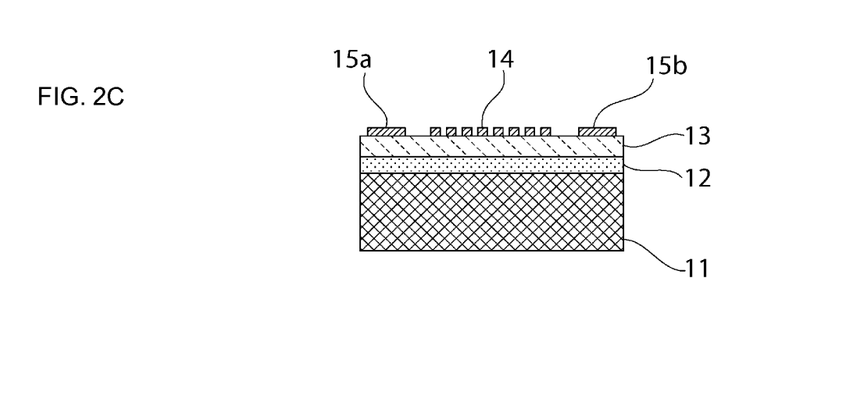

Next, as shown in FIG. 2C, the structure is turned upside down, and then, an IDT electrode 14 and electrode lands 15a and 15b are formed by photolithography on the piezoelectric layer 13 which is located on the upper side.

Figure 5:
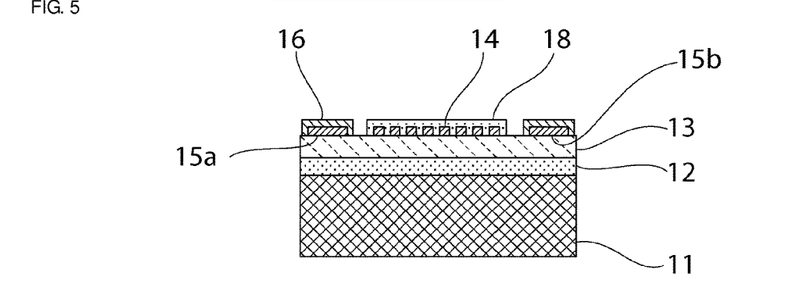
FIG. 5 is an elevational cross-sectional view illustrating a step of forming an elastic wave element in a method for manufacturing an elastic wave device according to the first preferred embodiment of the present invention.
Figure 6:
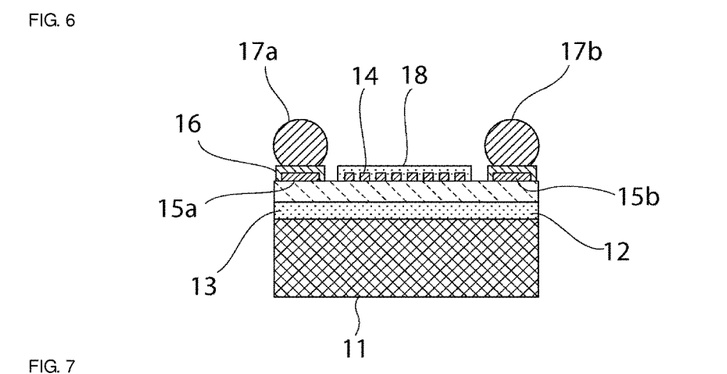
FIG. 6 is an elevational cross-sectional view showing an elastic wave element obtained in the elastic wave device according to the first preferred embodiment of the present invention.

Next, as shown in FIG. 5, wiring electrodes 16 are formed by photolithography, and a protective layer 18 is formed so as to cover the IDT electrode 14. Then, as shown in FIG. 6, bumps 17a and 17b are formed at portions where the electrode lands 15a and 15b are disposed. Thus, an elastic wave element 5 is formed.

Elastic wave elements 6 and 7 preferably are also formed by the same process as that described above.

Figure 7:
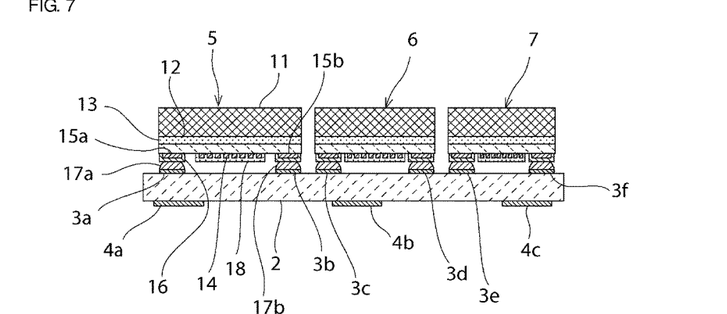
FIG. 7 is an elevational cross-sectional view illustrating a manufacturing step of an elastic wave device according to the first preferred embodiment of the present invention.

Next, as shown in FIG. 7, the elastic wave elements 5 to 7 are mounted on a mounting substrate 2 by a flip chip bonding method. In this preferred embodiment, the elastic wave elements 5, 6, and 7 preferably are each a duplexer including a transmitter filter and a receiver filter, for example. The elastic wave element 5 preferably is an 800 MHz band duplexer, the elastic wave element 6 preferably is a 2 GHz band duplexer, and the elastic wave element 7 preferably is a 2.7 GHz band duplexer, for example.

Figure 8:
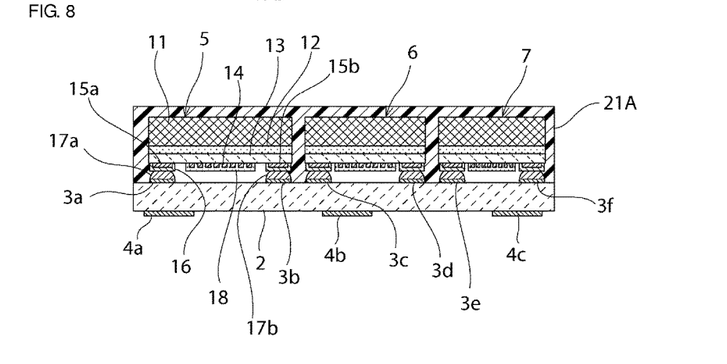
FIG. 8 is an elevational cross-sectional view illustrating a manufacturing step of an elastic wave device according to the first preferred embodiment of the present invention.

Next, as shown in FIG. 8, the elastic wave elements 5 to 7 are covered by a sealing resin layer 21A. The sealing resin layer 21A is arranged so as not to extend to the space between the surface provided with the IDT electrode in each of the elastic wave elements 5 to 7 and the mounting substrate 2.

Figure 9:
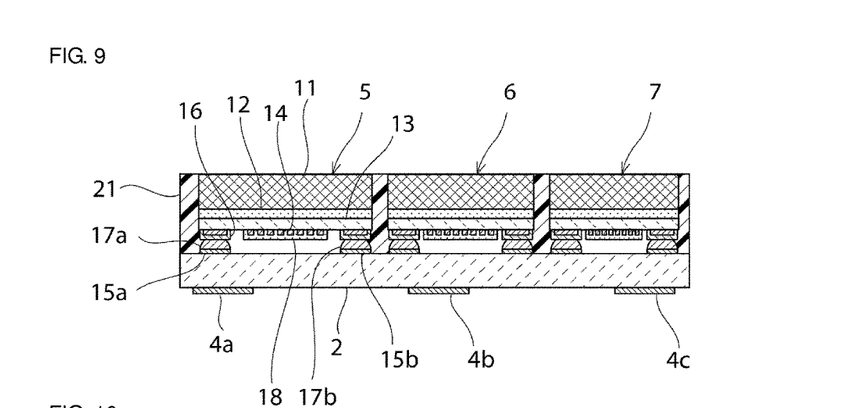
FIG. 9 is an elevational cross-sectional view illustrating a manufacturing step of an elastic wave device according to the first preferred embodiment of the present invention.

Then, the upper surface of the sealing resin layer 21A is ground to expose the upper surfaces of the supporting substrates 11. In such a manner, as shown in FIG. 9, the upper surface of the sealing resin layer 21 is made flush with the upper surfaces of the elastic wave elements 5 to 7.

Then, as shown in FIG. 10, an inorganic filler-containing resin layer 22 and a highly heat-conductive member 23 are bonded to the upper surfaces of the supporting substrates 11. In this preferred embodiment, a single highly heat-conductive member 23 is stacked so as to extend over the upper surfaces of the elastic wave elements 5 to 7. Consequently, the highly heat-conductive member 23 also extends over the spaces between the elastic wave elements 5, 6, and 7. Therefore, the heat-dissipating property is further enhanced. In addition, a structure in which the heat-dissipating property is enhanced is obtained by a simplified process and with a small number of components.

Furthermore, the coefficient of linear expansion of the supporting substrate 11 is lower than the coefficient of linear expansion of the piezoelectric layer 13. Therefore, when the temperature of the elastic wave device 1 rises, elongation of the piezoelectric layer 13 is significantly reduced or prevented by the supporting substrate 11. Consequently, the change in frequency characteristics with temperature is significantly reduced or prevented.

Furthermore, the steps shown in FIGS. 1A to 6 may be performed on a motherboard, and after the step shown in FIG. 5, by performing dicing, individual elastic wave elements 5 may be obtained.

Similarly, in order to obtain the elastic wave elements 6 and 7, after a plurality of elastic wave elements are formed on a mother board, singulation may be performed by dicing.

Figure 12:
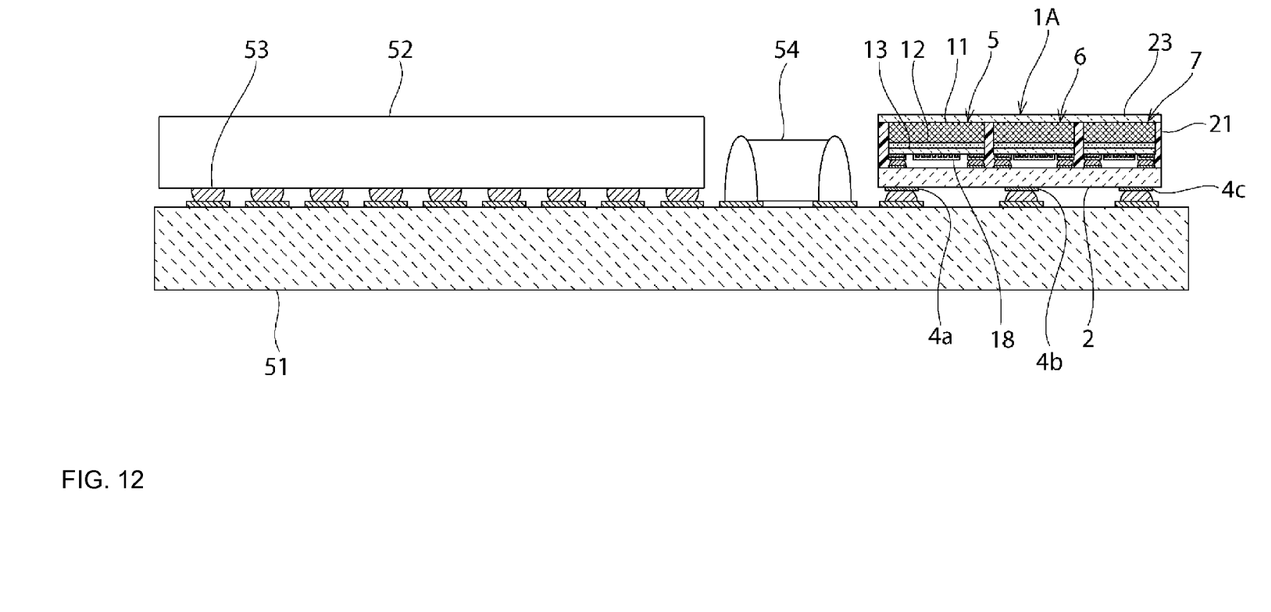
FIG. 12 is a schematic elevational cross-sectional view illustrating manufacturing steps of a module according to a second preferred embodiment of the present invention.
Figure 13:
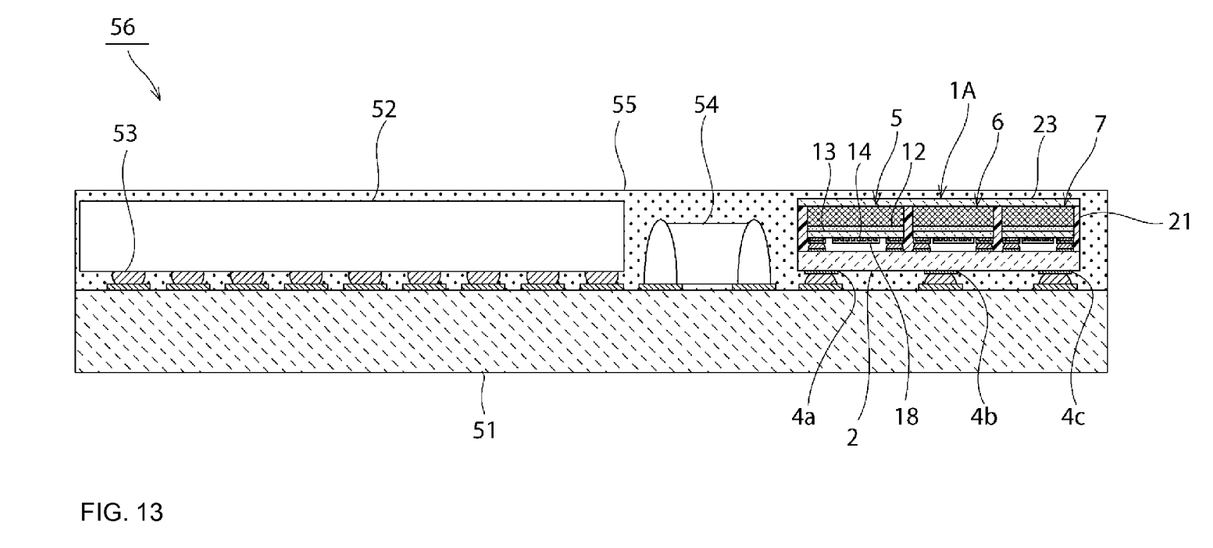
FIG. 13 is a schematic elevational cross-sectional view of a module according to the second preferred embodiment of the present invention.

FIGS. 12 and 13 are each a schematic elevational cross-sectional view illustrating manufacturing steps of a module including the elastic wave device 1 according to a second preferred embodiment of the present invention.

As shown in FIG. 12, a circuit board 51 is prepared. A semiconductor device 52 defining and serving as a switching device is bonded to and mounted on the circuit board 51 via a plurality of bumps 53. Furthermore, a capacitor element 54 is similarly mounted on the circuit board 51. Furthermore, an elastic wave device 1A according to a modification example of the first preferred embodiment obtained as described above is surface-mounted on the circuit board 51. The semiconductor device 52, the capacitor element 54, and the elastic wave device 1A are electrically connected to one another by wiring electrodes provided on or in the circuit board 51 so as to realize a desired function.

Next, as shown in FIG. 13, a resin layer 55 is formed so as to cover the semiconductor device 52, the capacitor element 54, and the elastic wave device 1A. As the resin layer 55, the inorganic filler-containing resin material described above can be suitably used.

In a module 56 thus obtained, the heat generated at the time of operation of the elastic wave device 1A is rapidly dissipated from the highly heat-conductive member 23 to the outside as described above. That is, the heat is rapidly released to the resin layer 55. Consequently, a variation in characteristics due to a change in temperature is significantly reduced or prevented, and a module having stable characteristics can be provided.

Figure 14:
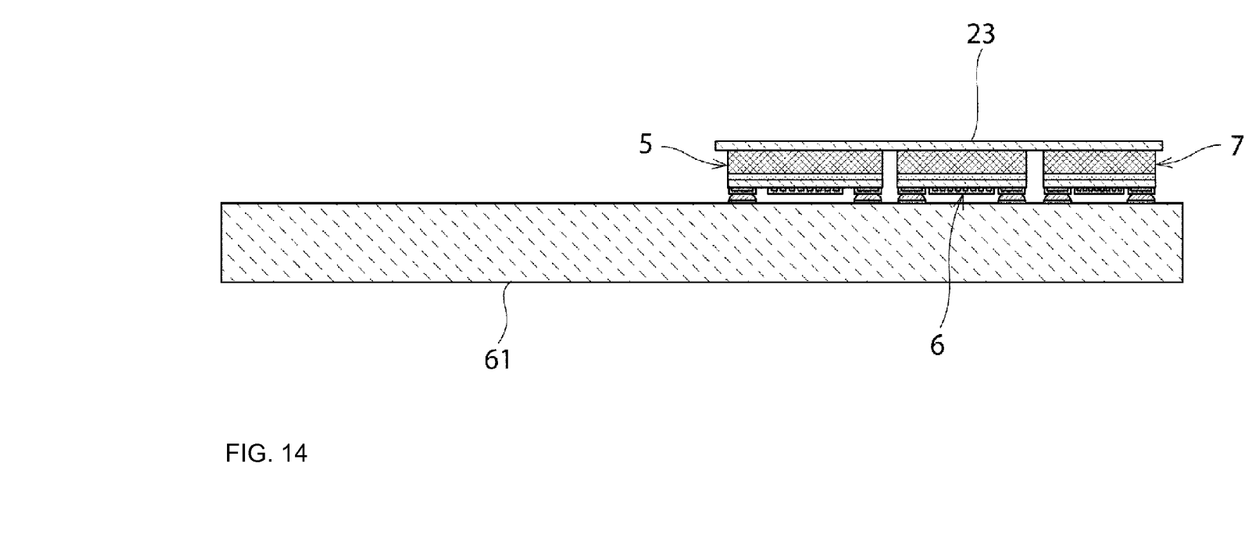
FIG. 14 is an elevational cross-sectional view illustrating a method for manufacturing an elastic wave device according to a third preferred embodiment of the present invention.
Figure 15:
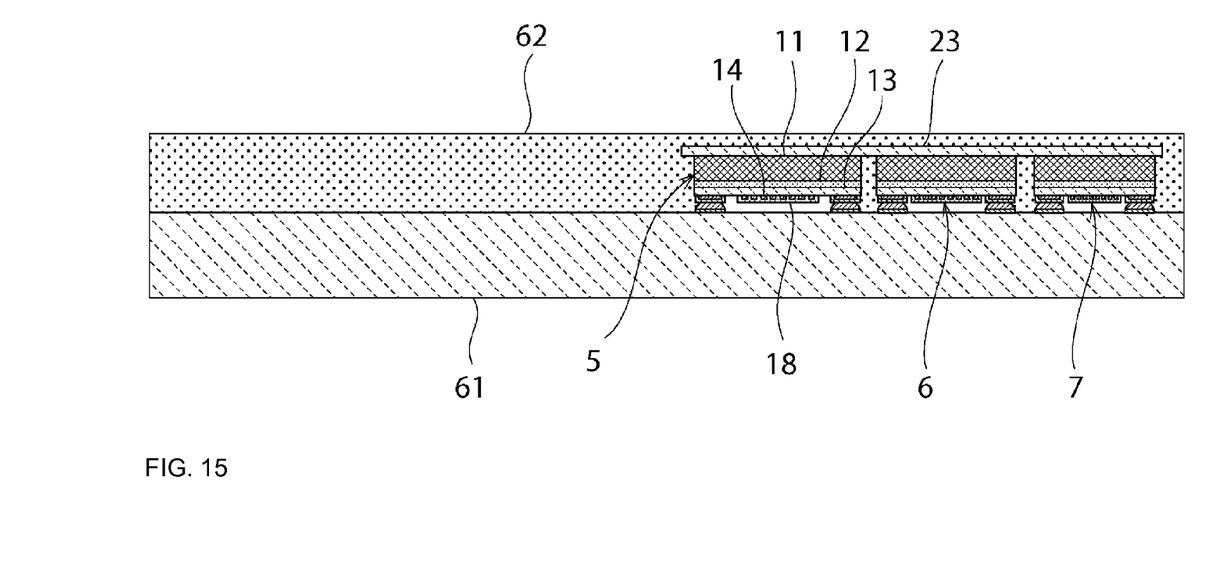
FIG. 15 is an elevational cross-sectional view of an elastic wave device according to the third preferred embodiment of the present invention.

FIGS. 14 and 15 are each an elevational cross-sectional view illustrating a method for manufacturing an elastic wave device according to a third preferred embodiment of the present invention.

In the third preferred embodiment, instead of the mounting substrate 2 described above, a semiconductor device substrate 61 is used. The elastic wave elements 5 to 7 prepared in the first preferred embodiment are mounted on the semiconductor device substrate 61 by the flip chip bonding method as in the first preferred embodiment. Then, a highly heat-conductive member 23 is bonded so as to extend over the upper surfaces of the supporting substrates of the elastic wave elements 5 to 7.

Next, as shown in FIG. 15, a resin layer 62 is formed so as to cover the elastic wave elements 5 to 7. In such a manner, the elastic wave elements 5 to 7 preferably are directly bonded to the semiconductor device substrate 61. That is, in the present invention, the electronic component member on which the elastic wave elements 5 to 7 are mounted may be not only a mere mounting substrate, but also a functional semiconductor device substrate, for example.

In the preferred embodiments described above, the elastic wave elements 5 to 7 are shown. However, the elastic wave element is not limited to a surface acoustic wave element, but a boundary acoustic wave element or a bulk acoustic wave element may be used.

In the preferred embodiments described above, a highly heat-conductive member 23 preferably is stacked so as to extend over the elastic wave elements 5 to 7. However, a highly heat-conductive member may be stacked on each of the elastic wave elements 5 to 7.

Figure 16:
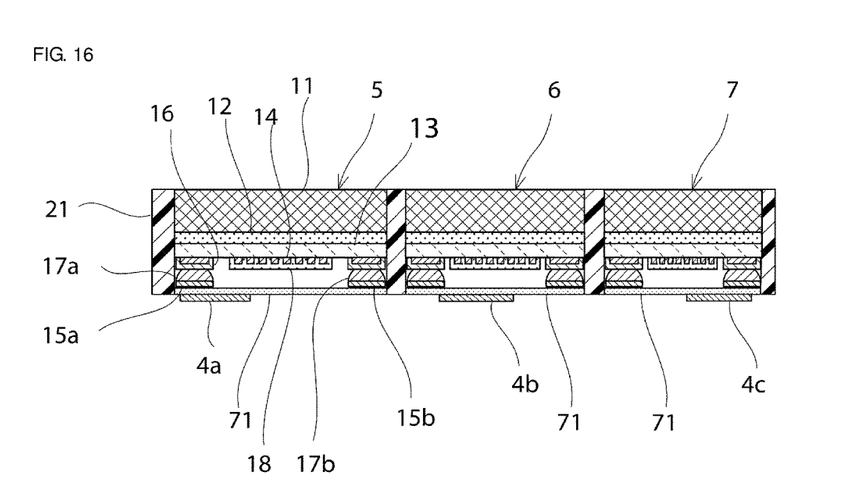
FIG. 16 is an elevational cross-sectional view showing a modification example of the elastic wave device shown in FIG. 9.

FIG. 16 shows a modification example of the elastic wave device shown in FIG. 9. In this modification example, a protective layer 71 is disposed below the IDT electrode 14 in each of the elastic wave elements 5 to 7. A vibration space facing the IDT electrode 14 is secured by the protective layer 71. The protective layer 71 preferably is composed of an appropriate synthetic resin or insulating ceramic. Outer electrodes 4a to 4c are preferably provided on the lower surfaces of the protective layers 71. Accordingly, a mounting substrate for flip chip mounting can be omitted. Consequently, a reduction in size of the elastic wave device is achieved. The outer electrodes 4a to 4c and the elastic wave elements 5 to 7 are electrically connected by wiring lines provided in portions not shown.

Furthermore, the elastic wave device according to various preferred embodiments of the present invention may include one elastic wave element only. Even in that case, since the highly heat-conductive member is directly or indirectly stacked on the surface of the supporting substrate, opposite to the piezoelectric layer, the heat-dissipating property is effectively enhanced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
   an elastic wave element which includes a supporting substrate, a piezoelectric layer directly or indirectly supported by the supporting substrate, and an electrode disposed in contact with the piezoelectric layer, in which the supporting substrate includes an insulating material, a thermal conductivity of the supporting substrate is higher than a thermal conductivity of the piezoelectric layer, and a coefficient of linear expansion of the supporting substrate is lower than a coefficient of linear expansion of the piezoelectric layer; and
   a highly heat-conductive member which is stacked on a first surface of the supporting substrate that is opposite to a second surface supporting the piezoelectric layer, and has a larger area than the first surface and a higher thermal conductivity than the piezoelectric layer; wherein
   the elastic wave element includes a plurality of elastic wave elements.

2. The elastic wave device according to claim 1, wherein the thermal conductivity of the highly heat-conductive member is higher than the thermal conductivity of the supporting substrate.

3. The elastic wave device according to claim 1, further comprising a mounting substrate on which the elastic wave element is mounted, and a resin layer disposed so as to cover the elastic wave element mounted on the mounting substrate, wherein the thermal conductivity of the highly heat-conductive member is higher than the thermal conductivity of the resin layer.

4. The elastic wave device according to claim 1, wherein a resonant frequency or a center frequency of at least one of the plurality of elastic wave elements is different from a resonant frequency or a center frequency of remaining ones of the elastic wave elements.

5. The elastic wave device according to claim 1, wherein the highly heat-conductive member extends over the plurality of elastic wave elements so as to be commonly used by the plurality of elastic wave elements.

6. The elastic wave device according to claim 1, wherein the highly heat-conductive member includes an inorganic filler-containing resin material in which an inorganic filler is dispersed in a resin.

7. The elastic wave device according to claim 1, wherein the electrode includes an Al electrode layer containing aluminum as a main component and includes an epitaxially grown, oriented film.

8. A method for manufacturing the elastic wave device according to claim 1, the method comprising:
   a step of performing ion implantation from a surface of a piezoelectric substrate having a larger thickness than that of the piezoelectric layer;
   a step of stacking a temporary supporting member on the surface of the piezoelectric substrate on which the ion implantation has been performed;
   a step of, while heating the piezoelectric substrate, separating a piezoelectric layer, at a high concentration ion-implanted region of the piezoelectric substrate in which the implanted ion concentration is highest, from a remaining portion of the piezoelectric substrate such that the piezoelectric layer remains on the temporary supporting member;
   a step of directly or indirectly stacking a supporting substrate on a surface of the piezoelectric layer, opposite to the surface on which the temporary supporting member is disposed;
   a step of separating the temporary supporting member from the piezoelectric layer directly or indirectly stacked on the supporting substrate;

a step of forming an electrode on the piezoelectric layer to constitute an elastic wave element including the supporting substrate, the piezoelectric layer, and the electrode; and a step of providing a highly heat-conductive member on a surface of the first substrate of the elastic wave element, opposite to the surface on which the piezoelectric layer is directly or indirectly stacked, the highly heat-conductive member having a larger area than the second surface of the elastic wave element and being composed of a highly heat-conductive material having a higher thermal conductivity than that of the piezoelectric layer.

9. The method for manufacturing the elastic wave device according to claim 8, wherein, in the step of stacking the supporting substrate on the piezoelectric layer, a dielectric layer having a higher thermal conductivity than the piezoelectric layer is formed on the piezoelectric layer, and the supporting substrate is stacked on the dielectric layer.

10. The method for manufacturing the elastic wave device according to claim 8, further comprising a step of forming the plurality of elastic wave elements defining the elastic wave element, and mounting the plurality of elastic wave elements on a mounting substrate such that the electrodes thereof face the mounting substrate; wherein
the highly heat-conductive member is stacked on surfaces of the supporting substrates of the mounted elastic wave elements, opposite to the surfaces on which the piezoelectric layers are disposed.

11. The method for manufacturing the elastic wave device according to claim 10, wherein the highly heat-conductive member is formed so as to extend over the plurality of elastic wave elements.

12. The method for manufacturing the elastic wave device according to claim 8, further comprising a step of forming an inorganic filler-containing resin layer in contact with the highly heat-conductive member.

13. An elastic wave device comprising:
an elastic wave element which includes a supporting substrate, a piezoelectric layer directly or indirectly supported by the supporting substrate, and an electrode disposed in contact with the piezoelectric layer, in which the supporting substrate includes an insulating material, a thermal conductivity of the supporting substrate is higher than a thermal conductivity of the piezoelectric layer, and a coefficient of linear expansion of the supporting substrate is lower than a coefficient of linear expansion of the piezoelectric layer; and
a highly heat-conductive member which is stacked on a first surface of the supporting substrate that is opposite to a second surface supporting the piezoelectric layer, and has a larger area than the first surface and a higher thermal conductivity than the piezoelectric layer; wherein
the supporting substrate includes at least one material selected from the group consisting of aluminum oxide, aluminum nitride, boron nitride, silicon carbide, silicon, and magnesium oxide.

14. The elastic wave device according to claim 13, wherein the highly heat-conductive member includes a metal.

15. An elastic wave device comprising:
an elastic wave element which includes a supporting substrate, a piezoelectric layer directly or indirectly supported by the supporting substrate, and an electrode disposed in contact with the piezoelectric layer, in which the supporting substrate includes an insulating material, a thermal conductivity of the supporting substrate is higher than a thermal conductivity of the piezoelectric layer, and a coefficient of linear expansion of the supporting substrate is lower than a coefficient of linear expansion of the piezoelectric layer; and
a highly heat-conductive member which is stacked on a first surface of the supporting substrate that is opposite to a second surface supporting the piezoelectric layer, and has a larger area than the first surface and a higher thermal conductivity than the piezoelectric layer; wherein
the highly heat-conductive member includes a material that contains, as a main component, at least one material selected from the group consisting of aluminum oxide, aluminum nitride, boron nitride, silicon carbide, magnesium oxide, and silicon.

16. The elastic wave device according to claim 15, further comprising an inorganic filler-containing resin layer which is in contact with the highly heat-conductive member and includes an inorganic filler-containing resin material.

17. The elastic wave device according to claim 16, wherein the inorganic filler-containing resin layer is a resin layer that covers the elastic wave element.

18. The elastic wave device according to claim 16, wherein the inorganic filler-containing resin material is an inorganic filler-containing resin material in which at least one filler selected from the group consisting of aluminum oxide, aluminum nitride, boron nitride, silicon carbide, magnesium oxide, silicon, silicon oxide, carbon, and cerium oxide is dispersed in a resin.

* * * * *